(12) United States Patent
Horie

(10) Patent No.: US 6,388,863 B1
(45) Date of Patent: May 14, 2002

(54) ELECTRONIC PART

(75) Inventor: Kenichi Horie, Machida (JP)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/762,655
(22) PCT Filed: Jun. 15, 2000
(86) PCT No.: PCT/EP00/05593
 § 371 Date: Feb. 12, 2001
 § 102(e) Date: Feb. 12, 2001
(87) PCT Pub. No.: WO00/77927
 PCT Pub. Date: Dec. 21, 2000

(30) Foreign Application Priority Data

Jun. 15, 1999 (JP) ............................................ 11-167988

(51) Int. Cl.⁷ ............................ H01G 4/005; H01G 4/12
(52) U.S. Cl. ..................... 361/303; 361/306.3; 361/313; 361/321.2
(58) Field of Search ............................... 361/301.3, 303, 361/306.3, 309, 313, 330, 321.2

(56) References Cited

U.S. PATENT DOCUMENTS 4,584,074 A * 4/1986 Sterling et al. .......... 204/181.1
6,278,602 B1 * 8/2001 Haratani et al. ............ 361/303

* cited by examiner

Primary Examiner—Cathy Lam
(74) Attorney, Agent, or Firm—Norman N. Spain

(57) ABSTRACT

An electronic part enabling a further efficient attenuation of high-frequency noises is provided. The first dielectric paste is applied onto a PET film (30) to form a ceramic sheet (31) having a dielectric constant $\in 1$ thereupon; and ceramic films (22_3, 22_4) are formed by applying the second dielectric paste on the ceramic sheet (31). Next, the pattern of the signal line (22_2) is printed by applying the conductive paste to the center of ceramic sheet (31) such that the right side (22_3a) of ceramic film (22_3) in the lengthwise direction and the left side (22_4a) of ceramic film (22_4) in the lengthwise direction are covered with the conductive paste; after that, further ceramic films (22_5, 22_6) are formed such that the lateral ends (22_2d, 22_2e) of the signal line (22_2) are sandwiched between the ceramic films (22_5, 22_6; and 22_3, 22_4).

2 Claims, 5 Drawing Sheets

ELECTRONIC PART

Field of the Invention

The present invention relates to an electronic part comprising a substrate and a conductive film formed inside the substrate.

Background of the Invention

Conventionally, it has been known that a chip type filter device incorporating capacitors and inductors serves as a preventive means against high frequency noises. Such a chip type filter device is manufactured by, for example, the following method.

Firstly, a dielectric sheet composed mainly of ceramic is prepared; a conductive film is formed on the dielectric sheet; by this, the dielectric sheet having the conductive film is manufactured. A number of such dielectric sheets carrying a conductive film are prepared; these dielectric sheets are placed one over another with a dielectric sheet carrying no conductive film inserted; and the assembly is pressed. Then, the dielectric sheets are bonded together by pressure, so that a lamination body having the stacked dielectric sheets is manufactured. The lamination body is sintered, and external electrodes are attached the sintered lamination body, so that a chip type filter device is manufactured.

FIG. 10 shows a schematic diagram of the cross-section of a part of the dielectric sheets of a filter device obtained by the above-described method. In the FIG. 10, two dielectric sheets 101 and 102 sandwiching a conductive film 100 (hatched part in the figure) are shown. As seen from the figure, the profile of conductive film 100 has a tapered shape at its both lateral ends 100a. Such a tapered shape is for this reason has a pressure applied onto the conductive film 100 when the stacked dielectric sheets 101 and 102 are pressed together. Therefore, the sectional area of the lateral end 100a of conductive film 100 is smaller than the sectional area of the center part 100b.

When electric current flows through the conductive film 100, the current flowing through the internal part of the film 100 becomes comparatively small and current has a tendency to concentrate to the external surfaces of the film 100 due to the surface effect. This tendency is brought to the fore, as the frequency of current becomes high. Therefore, the higher the frequency of current becomes, the higher the current density at the lateral ends 100a becomes. In other words, a ratio of current flowing through the lateral ends 100a having a comparatively small cross-section is larger than ratio of current flowing through the center part 100b having a comparatively large cross-section. Because of this, the higher the frequency of current becomes, the higher the apparent resistance of the conductive film becomes, which results in a considerable ohmic loss of the high frequency components of current. Because of this property, the DC and low frequency components of current flow efficiently through the conductive film 100 while the high-frequency components of current are efficiently attenuated.

As seen from above, even if high frequency noises invade the conductive film 100, it is possible to efficiently attenuate the noises by preparing the film 100 having the small sectional area at its lateral ends 100a. Therefore, if the sectional area of the lateral ends 100a of conductive film 100 can be more reduced, it will be possible to more efficiently attenuate high-frequency noises. However, reducing the sectional area of the lateral ends 100a of conductive film 100 naturally has a limit, and, when the sectional area in question is close to the limit, it is difficult to further prevent the invasion of high-frequency noises.

SUMMARY OF THE INVENTION

With the above situation as a background, an object of the present invention is to provide an electronic part as described in the opening paragraph, which enables a further efficient attenuation of high-frequency noises.

The object is thereby achieved in that the conductive film has lateral ends and an upper and a lower surface, the substrate contains in peripheral parts at the lateral ends of the conductive film a first dielectric material, the substrate contains in peripheral parts at the upper and lower surfaces of the conductive film a second dielectric material, and the first dielectric material has a larger dielectric constant than the second dielectric material.

According to this invention, as described above, as to the dielectric materials constituting the substrate, first dielectric materials present in the peripheral parts of the lateral end of the conductive film have a higher dielectric constant than second dielectric materials present in the peripheral part of the upper and lower surfaces of the conductive film. Generally, if there is a dielectric material in contact with or close to the lateral end of a conductive film, the higher the dielectric constant of the dielectric material becomes, the more the tendency of concentrating electrical charge on the lateral end of conductive film accelerate. Therefore in the case of comparing an electronic part according to the present invention with an electronic part where the dielectric constant of the dielectric material is consistent across the entire part surrounding conductive film, the current density at the lateral end of the conductive film of the former electric part becomes higher than that of the latter electric part. Thus, in the case that the sectional area of the lateral end of conductive film is made smaller than the sectional area of the central part of the same film, when current flows through that conductive film, it is possible to efficiently flow the DC and low-frequency components of current through the film, and efficiently attenuate the high-frequency—for example higher than 20 MHz—components of the same current.

In an advantageous embodiment, the substrate contains a first and a second electrode, which are insulated from the conductive film by the dielectric material present in the peripheral parts at the lower and the upper surfaces of the conductive film. Having two electrodes with dielectric material in between, the electronic part functionally contains a capacitor. The electronic part of this embodiment is for example an EMI-filter.

Preferably, the electrodes are cross-shaped. By further preference, the electrodes are stacked in between said dielectric material and another layer of dielectric material. This provides a good insulation. It is also advantageous, that the electronic part is surface mountable. This can be achieved with u-shaped terminations on at least two sides of the electronic part. If the electronic part is an EMI-filter, the terminations are present at two pairs of opposite sides of the electronic part. In this case the conductive film extends from the one to the other side of one pair of opposite sides, and the electrodes extend from the one to the other side of the other pair of opposite sides.

The ratio of the dielectric constants of the first and the second dielectric material is larger than 1, for example 2 or 10 or 20. In a further embodiment of the electronic part of the invention, the dielectric constant of the first dielectric material is at least five times as high as the dielectric constant of the second dielectric material. By having a difference of five an electronic part with an excellent attenuation of high-frequency noises is obtained. Examples of dielectric materials include $SiN_3$, $MgO$—$SiO_2$, $CaO$—$MgO$—$TiO_2$, $BaO$—$TiO$—$SnO_2$, $BaO$—$MgO$—$CoO$—$Nb_2O_5$, $BaO$—$Nd_2O_3$—$TiO_2$—$Bi_2O_3$—$Al_2O_3$—$MnO$, $BaO$—$MgO$—$Ta_2O_5$, $ZrO_2$—$SnO_2$—$PbO$—$CaO$—$ZrO_2$, $CaO$—$MgO$—$TiO_2$, $SrO$—$ZrO_2$—$TiO_2$, $BaO$—$Sm_2O_5$—$TiO_2$, $PbO$—$BaO$—$Nd_2O_3$—$TiO_2$ and $Li_2O$—$Na_2O$—$Sm_2O_5$—$TiO_2$—systems. Such materials with dielectric constants from 4 to 120 are known in the art of manufacturing ceramics. It has also been known, how to adapt the dielectric constant to a suitable value.

These and other aspects of the invention will be further explained with reference to the figures, in which non-limiting embodiments are shown, of which figures FIG. 1 is a perspective view of an EMI filter which is an example of electronic part according to the present invention.

DETAILED DESCRIPTION OF THE PREFERRED EMBODIMENTS

Figure 1:
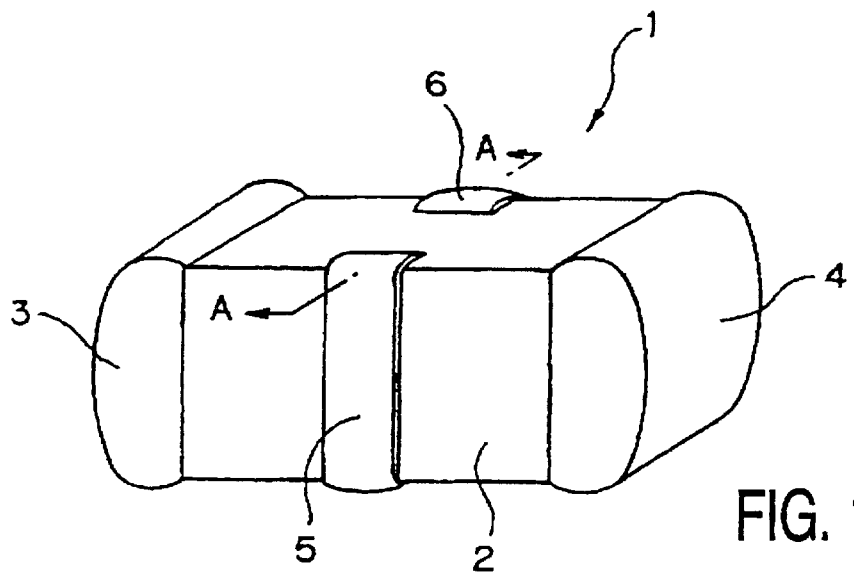

FIG. 1 is a perspective view of an EMI filter which is an example of electronic part according to the present invention. EMI filter 1 comprises a rectangular parallelepiped-shaped ceramic body 2 (one example of the substrate according to this invention) composed mainly of ceramic. The terminal electrodes 3 and 4 are attached at side surfaces of the ceramic body 2, and ground electrodes 5 and 6 are attached at front and back surfaces of the ceramic body 2.

Figure 2:
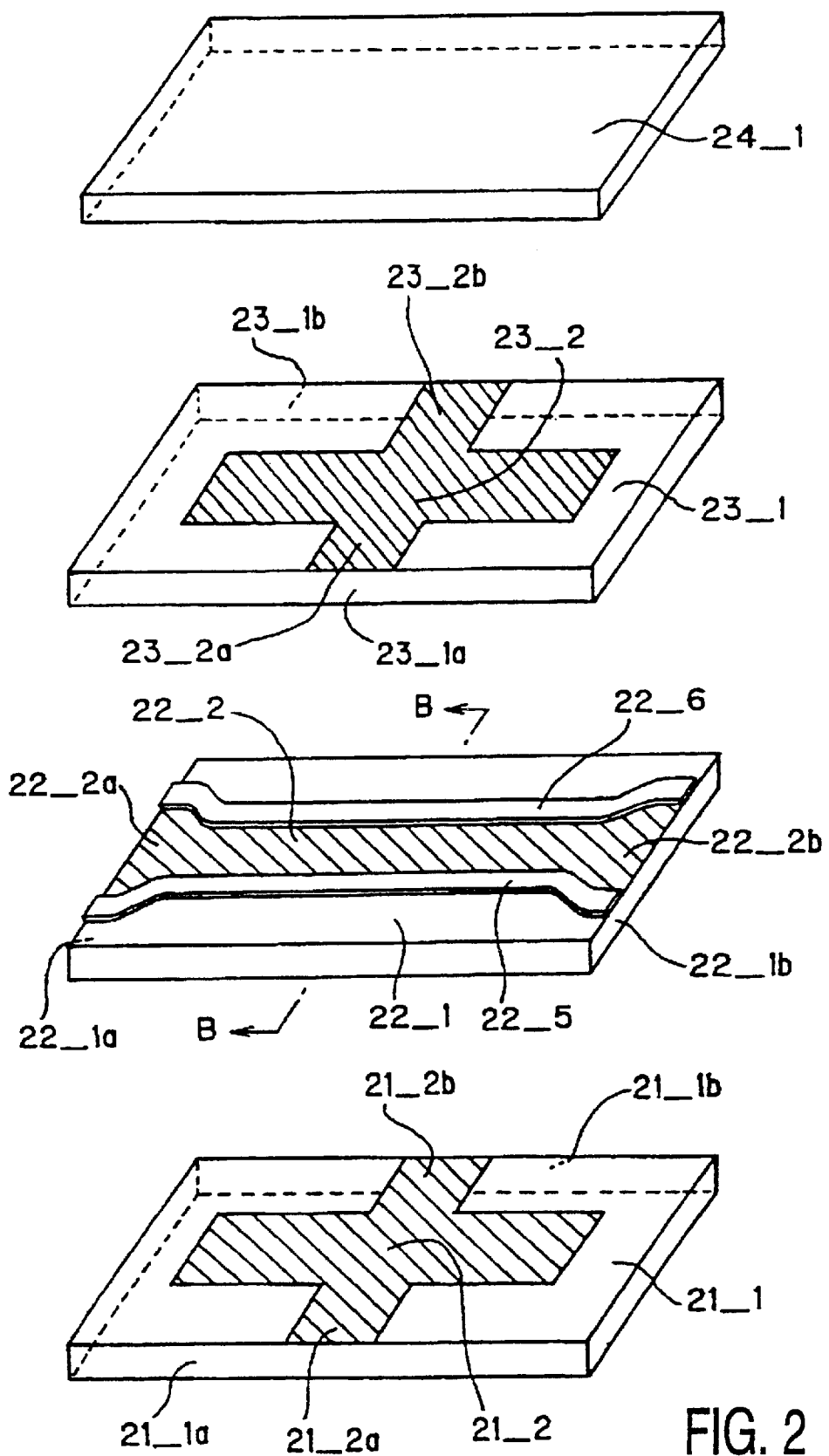
FIG. 2 shows an exploded perspective view of the ceramic body of the EMI filter shown in FIG. 1, the ceramic body disintegrated into four layers.

FIG. 2 shows a exploded perspective views of the ceramic body of the EMI filter shown in FIG. 1, the ceramic body is disintegrated into four layers. The ceramic body 2 comprises four flat ceramic layers 21_1, 22_1, 23_1 and 24_1. Each of the four ceramic layers is formed by stacking a number of ceramic sheets composed mainly of ceramic having a dielectric constant $\in 1$. A cross-shaped grounding electrode 21_2 is formed on the surface of the lowest ceramic layer 21_1 of four ceramic layers 21_1, 22_1, 23_1 and 24_1. The end parts 21_2a and 21_2b of the grounding electrode 21_2 reach as far as the side end surfaces 21_1a and 21_1b of the ceramic layer 21_1, respectively. Just above the ceramic layer 21_1 having the cross-shaped grounding electrode 21_2, the ceramic layer 22_1 is stacked.

Figure 3:
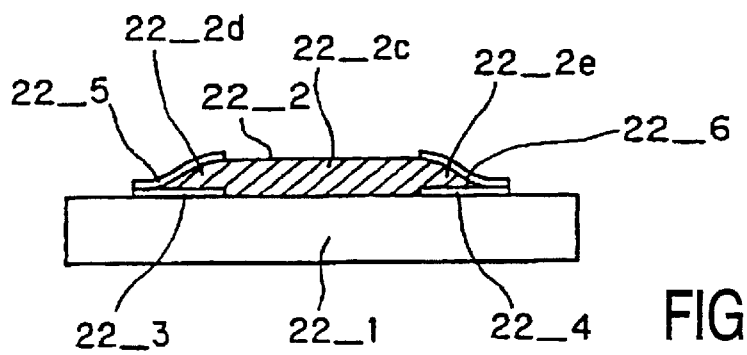
FIG. 3 is a sectional view of the ceramic layer 22_1 shown in FIG. 2 viewed from the direction B—B.

FIG. 3 is a sectional view of the ceramic layer 22_1 shown in FIG. 2 viewed from the direction B—B. Two ceramic films 22_3 and 22_4 which extend from one end surface 22_1a (see FIG. 2) to the other end surface 22_1b (see FIG. 2) are formed on the surface of the ceramic layer 22_1. The ceramic films 22_3 and 22_4 are composed mainly of ceramic with a dielectric constant $\in 2$ ($>\in 1$). The two ceramic films 22_3 and 22_4 are formed along the lateral ends 22_2d and 22_2e of a signal line 22_2 described below. On the surface of ceramic layer 22_1, there is formed a signal line 22_2 across ceramic layer 22_1 as shown in FIG. 2. The end parts 22_2a and 22_2b of the signal line 22_2 extend as far as the end surfaces 22_1a and 22_1b of ceramic layer 22_1. And as shown in FIG. 3, the lateral ends 22_2d and 22_2e of signal line 22_2 are overlapped over a part of the ceramic films 22_3 and 22_4. The lateral ends 22_2d and 22_2e of signal line 22_2 has a tapered shape, and thus the sectional area of the lateral ends 22_2d and 22_2e of signal line 22_2 is smaller than the sectional area of the central part 22_2c of the same signal line 22_2. On the ceramic layer 22_1 are formed two further ceramic films 22_5 and 22_6 composed mainly of ceramic having a dielectric constant of $\in 2$ ($>\in 1$). The two ceramic films 22_5 and 22_6 are formed in such a way that the lateral ends 22_2d and 22_2e of signal line 22_2 are sandwiched between the ceramic films 22_5, 22_6 and ceramic films 22_3, 22_4, respectively.

Just over the ceramic layer 22_1, a ceramic layer 23_1 is stacked. A grounding electrode 23_2 is formed on the surface of the ceramic layer 23_1. The shape of the grounding electrode 23_2 is identical with the shape of the grounding electrode 21_2 formed on the lowest ceramic layer 21_1. The end parts 23_2a and 23_2b of the grounding electrode 23_2 extend as far as the side end surfaces 23_1a and 23_1b of the ceramic layer 23_1, respectively. Just over the ceramic layer 23_1, top ceramic layer 24_1 is stacked.

The ceramic body 2 shown in FIG. 1 comprises the ceramic layers 21_1, 22_1, 23_1 and 24_1 laid one over another in order. Since the signal line 22_2 formed on the ceramic layer 22_1 of FIG. 2 has end parts 22_2a and 22_2b which extend as far as end surfaces 22_1a and 22_1b of the ceramic layer 22_1, the terminal electrodes 3 and 4 of FIG. 1 are connected to the end parts 22_2a and 22_2b of the signal line 22_2, respectively. Further, since the grounding electrodes 21_2 and 23_2 formed on the ceramic layers 21_1 and 23_1 respectively extend as far as the side end surfaces of the ceramic layers 21_1 and 23_1, the ground electrodes 5 and 6 of FIG. 1 are connected to both of the grounding electrodes 21_2 and 23_2.

Figure 4:
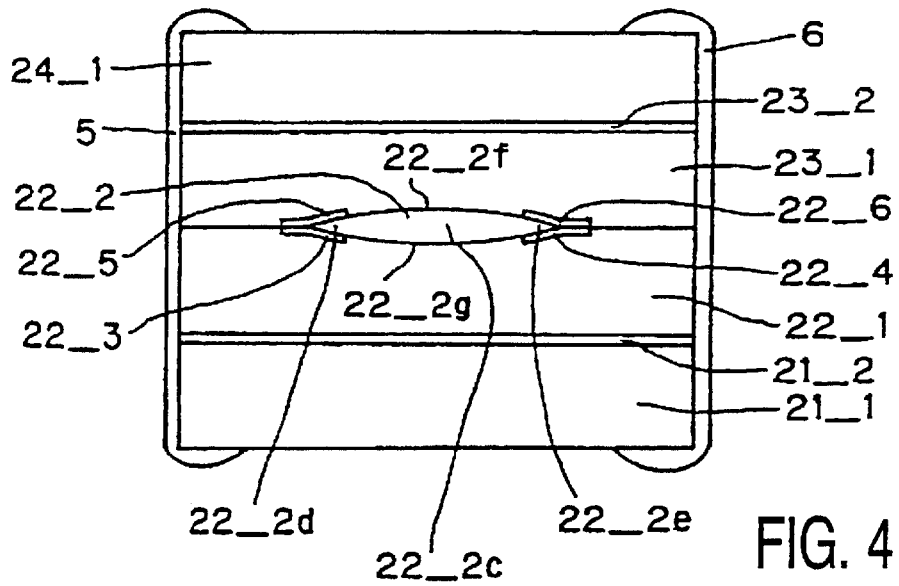
FIG. 4 shows schematically the cross-section of the filter device shown in FIG. 1 viewed from direction A—A.

FIG. 4 shows schematically the cross-section of the filter device 1 shown in FIG. 1 viewed from direction A—A. As shown in the figure, ceramic layers 22_1 and 23_1 composed of ceramic having a dielectric constant $\in 1$ are present in the peripheral parts of the upper and lower surfaces 22_2f and 22_2g of signal line 22_2, while ceramic films 22_3, 22_4, 22_5 and 22_6 with a dielectric constant $\in 2$ ($>\in 1$) are present in peripheral parts of the lateral ends 22_2d and 22_2e of the same signal line 22_2.

Figure 5:
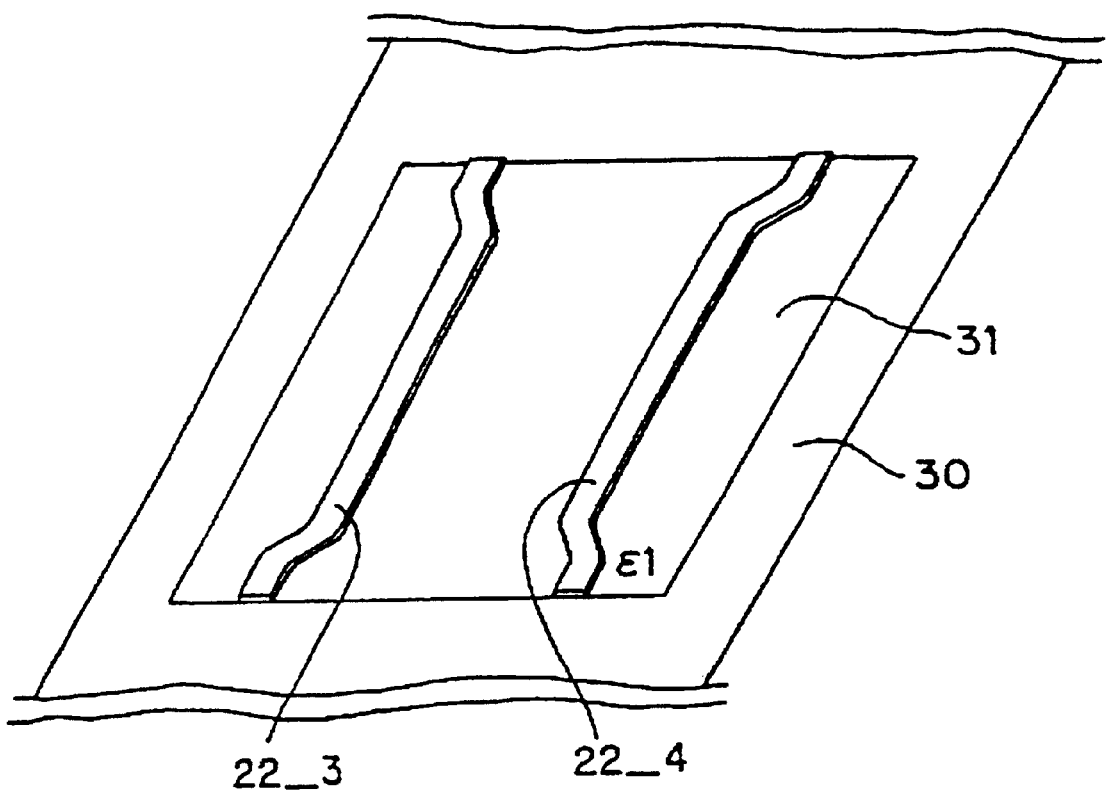
FIG. 5 shows a ceramic film formed to a ceramic sheet.
Figure 6:
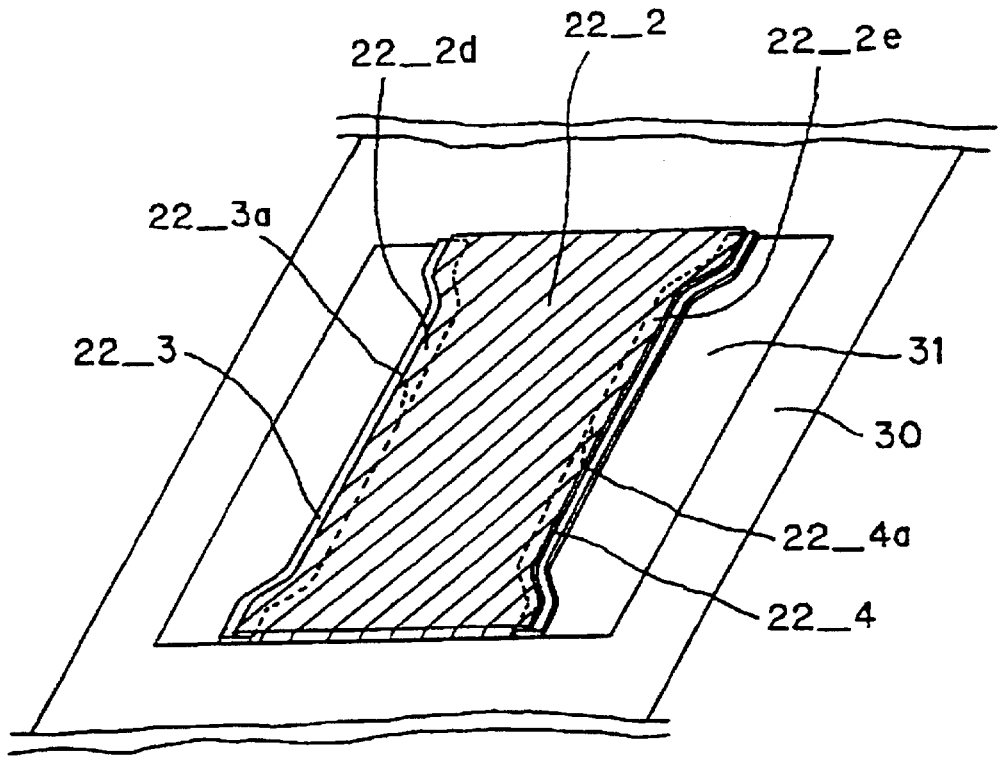
FIG. 6 shows a signal line formed to a ceramic sheet.
Figure 7:
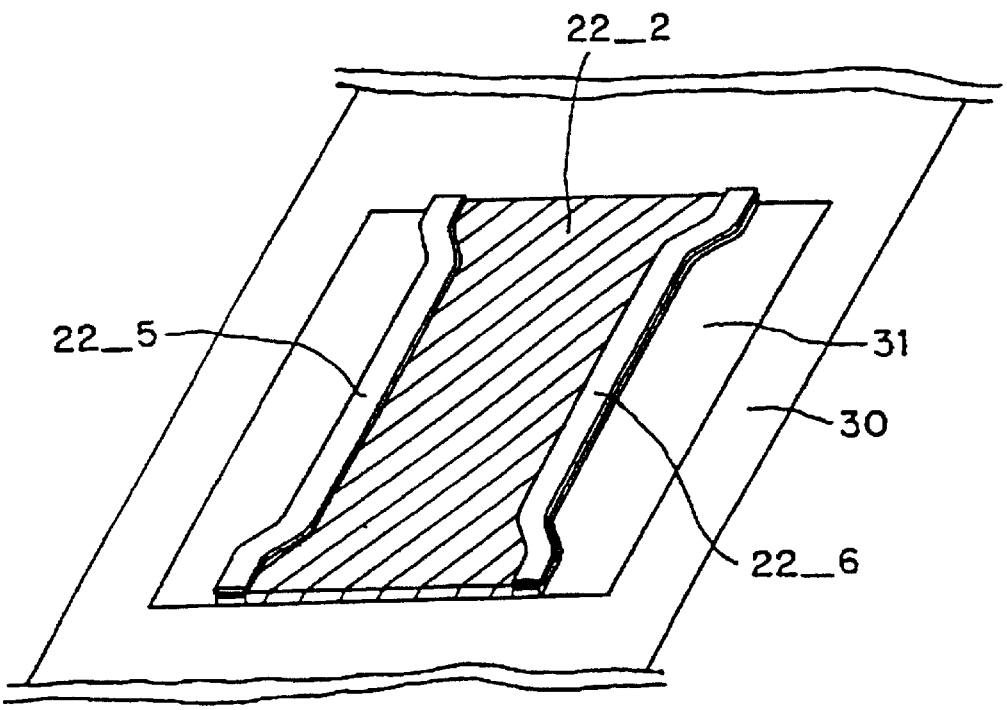
FIG. 7 shows a ceramic film overlapped over the signal line.

FIGS. 5–7 show how signal line 22-2 is formed. Firstly, as shown in FIG. 5, the first dielectric paste is applied onto a PET film 30 to form a ceramic sheet 31 thereupon (dielectric constant $\in 1$); and ceramic films 22_3 and 22_4 (see FIG. 4) are formed by applying the second dielectric paste on the ceramic sheet 31. Next, the pattern of the signal line 22_2 is printed by applying the conductive paste at the center of ceramic sheet 31 in such a way that the right side 22_3a of ceramic film 22_3 in the lengthwise direction and the left side 22_4a of ceramic film 22_4 in the lengthwise direction are covered with the conductive paste. Through this process, a conductive film serving as signal line 22_2 is formed.

Then, ceramic films 22_5 and 22_6 are formed in such a way that the lateral ends 22_2d and 22_2e of signal line 22_2 are sandwiched between the ceramic films 22_5, 22_6 and the ceramic films 22_3, 22_4, respectively (see FIG. 7).

Grounding electrode 21_2 or 23_2, or signal line 22_2 is formed on a ceramic sheet in the manner as described above. Then, the ceramic sheet is peeled off from the PET film. The ceramic sheet having no conductive pattern printed is also peeled off from the PET film.

Then, a ceramic sheet having a grounding electrode 21_2 formed thereupon, a ceramic sheet having a signal line 22_2 formed, and a ceramic sheet having a grounding electrode 23_2 formed are stacked one after another with a stacked body consisting of the stacked plural ceramic sheets having no conductive pattern inserted between adjacent sheets having signal line or grounding electrode; the assembly is pressed while heating. Through this process a ceramic body 2 (see FIG. 1) is formed. At this time, by pressing the assembly, the shape of the lateral ends 22_2d and 22_2e of signal line 22_2 becomes a tapered shape as shown in FIG. 4.

Then, the ceramic body 2 is sintered; and terminal electrodes 3 and 4, and ground electrodes 5 and 6 are attached to the ceramic body 2. The EMI filter 1 shown in FIG. 1 is manufactured by the above procedure.

Figure 8:
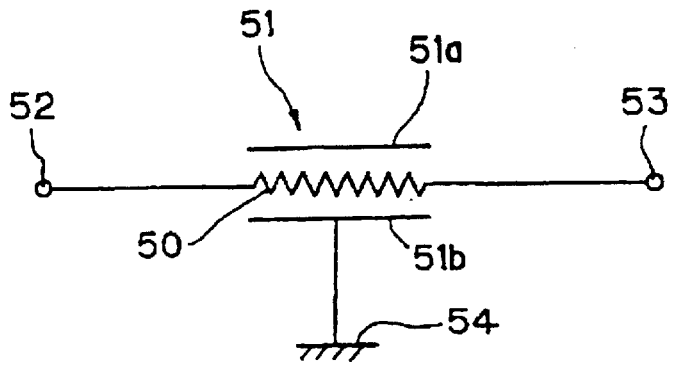
FIG. 8 shows an equivalent circuit of the EMI filter 1.

FIG. 8 shows an equivalent circuit of the EMI filter 1. The equivalent circuit of EMI filter 1 is represented by a resistance 50 and capacitor 51. The resistance 50 is formed by signal line 22_2 (see FIG. 2), and the magnitude of the resistance 50 depends on the frequency of current flowing through the resistance 50. The capacitor 51 is formed by electrodes 51a and 51b corresponding to grounding electrodes 23_2 and 21_2 (see FIG. 2). The resistance 50 is positioned between the two electrodes 51a and 51b. Resistance 50 is connected to a terminal 52 corresponding to the terminal electrode 3 (see FIG. 1) and is connected to a terminal 53 corresponding to the terminal electrode 4, while capacitor 51 is connected to a grounding terminal 54 corresponding to the ground electrodes 5 and 6 (see FIG. 2). Since the capacitor 51 is connected to grounding terminal 54, high frequency noises can be discharged through the grounding terminal 54 outside the EMI filter 1.

In this mode of this embodiment, as shown in FIG. 4, the one lateral end 22_2d of the signal line 22_2 is sandwiched between ceramic films 22_3 and 22_5, and the other lateral end 22_2e is sandwiched between ceramic films 22_4 and 22_6. The dielectric constant $\in 2$ of these ceramic films 22_3, 22_4, 22_5 and 22_6 is larger than the dielectric constant $\in 1$ of ceramic layers 22_1 and 23_1 sandwiching the signal line 22_2 from above and below. If current flows through the signal line 22_2, its DC and low-frequency components largely flow through the central part 22_2c of the signal line 22_2, while its high-frequency components tend to concentrate on the lateral ends 22_2d and 22_2e of the same line 22_2 due to the surface effect. Further, as described above, since the dielectric constant of ceramic films 22_3, 22_4, 22_5 and 22_6 present in the peripheral part of the lateral ends 22_2d and 22_2e of signal line 22_2 is larger than the dielectric constant of the ceramic layers 22_1 and 23_1, the tendency of concentrating the high-frequency components on the lateral ends 22_2d and 22_2e of the signal line 22_2 is further enhanced, and thus the current density at the lateral ends 22_2d and 22_2e becomes increased.

Figure 9:
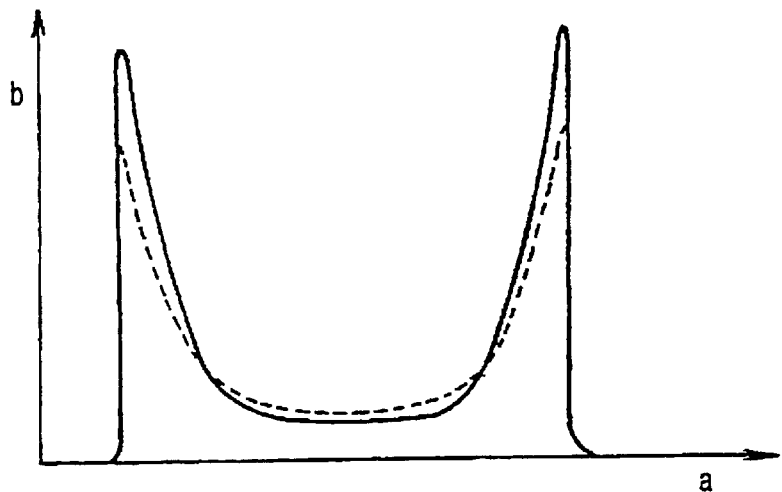
FIG. 9 is a graph showing the density of high-frequency current flowing through the signal line 22_2.
Figure 10:
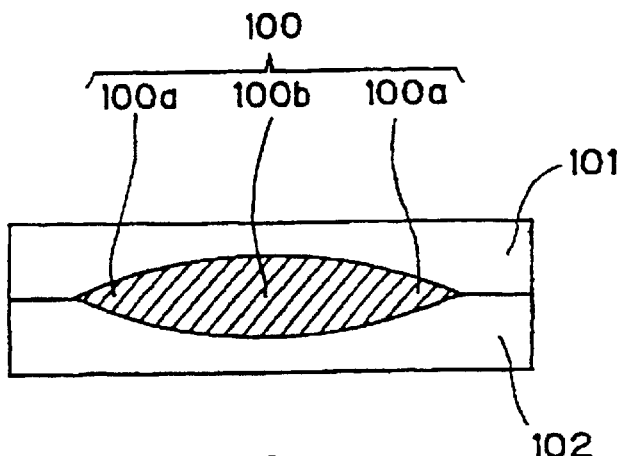
FIG. 10 shows a schematic diagram of the cross-section of a part of the dielectric sheets of a filter device obtained by the above-described method.

FIG. 9 is a graph showing the density of high-frequency current flowing through the signal line 22_2. The horizontal axis of the graph of FIG. 9 shows a part of signal line 22_2 as to the wide direction a of signal line 22_2, while the vertical axis shows the density of current b at each part of the signal line 22_2. The solid line of the graph represents the distribution of density of current flowing through the signal line 22_2 of an EMI filter 1 according to this mode of embodiment, while the interrupted line represents the distribution of density of current flowing through the signal line 22_2 in the case that the dielectric constant $\in 2$ of ceramic films 22_3, 22_4, 22_5 and 22_6 is made equal to the dielectric constant $\in 1$ of ceramic layers 22_1 and 23_1.

It is obvious from this graph that making the dielectric constant $\in 2$ of ceramic films 22_3, 22_4, 22_5 and 22_6 larger than the dielectric constant $\in 1$ of ceramic layers 22_1 and 23_1 will result in enhancement of the density of current flowing through the lateral ends 22_2d and 22_2e of signal line 22_2. Thus, since current concentrates on the lateral ends 22_2d and 22_2e which have a comparatively small sectional area, the ohmic loss of high-frequency components increases.

Therefore, even if high-frequency noises invade the signal line, use of the EMI filter 1 of this mode of embodiment will enable efficient attenuation of those high-frequency noises.

In this mode of embodiment, the dielectric constants of ceramic layers 21_1, 22_1, 23_1 and 24_1 are all the same, being $\in 1$. However, as long as the increasing of the current density at the lateral ends 22_2d and 22_2e of signal line 22_2 is not hindered, the dielectric constants of those ceramic layers may not be necessarily the same, that is to say, they may be different from each other. The substrate according to this invention may contain a material with a dielectric constant $\in 3$ in addition to materials with dielectric constants $\in 1$ and $\in 2$, as long as the dielectric materials present in the peripheral part of the lateral ends 22_2d and 22_2e of signal line 22_2 have a larger dielectric constant than that of the dielectric materials present in the peripheral part of the upper and lower surfaces of the signal line 22_2.

In this mode of embodiment, ceramic films 22_3, 22_4, 22_5 and 22_6, which having a dielectric constant $\in 2$ larger than the dielectric constant $\in 1$ of ceramic layers 22_1 and 23_,are formed in such a way that the ceramic films 22_3, 22_4, 22_5 and 22_6 contact with the lateral ends 22_2d and 22_2e of signal line 22_2. However, the ceramic films 22_3, 22_4, 22_5 and 22_6 may not necessarily come into contact with the lateral ends 22_2d and 22_2e of signal line 22_2, as long as the ceramic films 22_3, 22_4, 22_5 and 22_6 are formed on the periphery of the lateral ends 22_2d and 22_2e . Further, in this mode of embodiment, a ceramic body 2 is used to serve as the substrate according to this invention. However, the signal line 22_2 may be formed to the substrate having the dielectric materials other than ceramic, as long as a dielectric material present in the peripheral part of the lateral ends 22_2d and 22_2e of signal line 22_2 has a larger dielectric constant than that of dielectric materials present in the peripheral part of the upper and lower surfaces of the signal line 22_2. That is to say, as long as a dielectric material present in the peripheral part of the lateral ends 22_2d and 22_2e of signal line 22_2 has a larger dielectric constant than that of dielectric materials present in the peripheral part of the upper and lower surfaces of the signal line 22_2, the dielectric materials constituting the substrate according to the present invention may not be limited to any specific ones, further, the dielectric material present the peripheral part of the lateral ends 22_2d and 22_2e of signal line 22_2 may or may not contact with signal line 22_2.

Furthermore, in this mode of embodiment, an EMI filter 1 is shown as an example of an electronic part according to the present invention. However, even if this invention is applied for further electronic parts than the EMI filter, in the case that a material with a larger dielectric constant than material present in the peripheral part of the upper and lower surfaces of the conductive film of the further electronic parts is used as a material present in the peripheral part of the lateral ends of the conductive film of the further electronic parts, it will be possible to efficiently attenuate high-frequency components.

As described above, according to an electronic part of the present invention, it is possible to more efficiently attenuate high-frequency components.

What is claimed is:

1. An electronic part (1) comprising a substrate (2) and a conductive film (22_2) formed inside the substrate (2), characterized in that the conductive film (22_2) has lateral ends (22_2d, 22_2e) and an upper and a lower surface (22_2f, 22_2g), the substrate (2) contains in peripheral parts (22_3, 22_4, 22_5, 22_6) at the lateral ends (22_2d, 22_2e) of the conductive film (22_2) a first dielectric material, the substrate contains in peripheral parts (22_1, 23_1) at the upper and lower surfaces (22_2f, 22_2g) of the conductive film (22_2) a second dielectric material, and the first dielectric material has a larger dielectric constant than the second dielectric material.

2. An electronic part (1) as claimed in claim 1, characterized in that the substrate (2) contains a first (21_2) and a second electrode (23_2), which are insulated from the conductive film (22_2) by the dielectric material present in the peripheral parts (22_1, 23_1) at the lower and the upper surfaces (22_2f, 22_2g) of the conductive film (22_2).

* * * * *